(12) United States Patent
Schade Van Westrum et al.

(10) Patent No.: US 8,435,352 B2
(45) Date of Patent: May 7, 2013

(54) APPARATUS AND METHOD FOR COATING A SUBSTRATE

(75) Inventors: Johannes Alphonsus Franciscus Maria Schade Van Westrum, Zevenaar (NL); Laurent Christophe Bernard Baptiste, Amsterdam (NL); Gerardus Gleijm, Ijmuiden (NL)

(73) Assignee: Tata Steel Nederland Technology BV, Ijmuiden (NL)

( * ) Notice: Subject to any disclaimer, the term of this patent is extended or adjusted under 35 U.S.C. 154(b) by 1143 days.

(21) Appl. No.: 11/913,580

(22) PCT Filed: Apr. 27, 2006

(86) PCT No.: PCT/EP2006/003924
§ 371 (c)(1),
(2), (4) Date: Nov. 5, 2007

(87) PCT Pub. No.: WO2006/128532
PCT Pub. Date: Dec. 7, 2006

(65) Prior Publication Data
US 2008/0280066 A1 Nov. 13, 2008

(30) Foreign Application Priority Data

May 31, 2005 (EP) .................................... 05076265

(51) Int. Cl.
*C23C 16/00* (2006.01)

(52) U.S. Cl.
USPC .......................................... 118/726; 118/715

(58) Field of Classification Search .................. 118/726, 118/715
See application file for complete search history.

(56) References Cited

U.S. PATENT DOCUMENTS

| | | | | |
|---|---|---|---|---|
| 4,959,524 | A * | 9/1990 | de Rudnay | 392/388 |
| 6,830,626 | B1 * | 12/2004 | Smith | 118/726 |
| 7,220,450 | B2 | 5/2007 | Schade Van Westrum et al. | |
| 2002/0185069 | A1 * | 12/2002 | Hoffmann et al. | 118/726 |
| 2003/0203638 | A1 * | 10/2003 | Van Slyke | 438/709 |
| 2004/0016400 | A1 * | 1/2004 | Kim et al. | 118/667 |
| 2004/0163600 | A1 * | 8/2004 | Hoffmann et al. | 118/726 |
| 2004/0255857 | A1 * | 12/2004 | Chow et al. | 118/715 |
| 2005/0064110 | A1 * | 3/2005 | Schade Van Westrum et al. | 427/591 |

FOREIGN PATENT DOCUMENTS

| | | |
|---|---|---|
| JP | 08104981 | 4/1996 |
| JP | 2000 328239 | 11/2000 |
| WO | 0206558 | 1/2002 |
| WO | 03 071000 | 8/2003 |
| WO | WO 03/071000 * | 8/2003 |

OTHER PUBLICATIONS

Schmitz B et al: "Jet Vapor Deposition, A Novel Vacuum Coating Technique With Superior Properties. JVD : Un Nouveau Procede De Revetement Sous Vide Pour Des Produits a Properietes Ameliorees" Cahiers D'Informations Techniques De La Revue De Metallurgie, Revue De Metallurgie. Paris, FR, vol. 97, No. 7/8, Jul. 2000. pp. 971-978. XP000976084 ISSN: 0035-1563 p. 971, right-hand column, line 15-line 21, p. 973, left-hand column, line 1-right-hand column, line 7; figures 1, 2.

* cited by examiner

*Primary Examiner* — Keath Chen
(74) *Attorney, Agent, or Firm* — Novak Druce Connolly Bove + Quigg, LLP

(57) ABSTRACT

An apparatus for coating a substrate using physical vapor deposition, including a vacuum chamber wherein a coil is placed for keeping an amount of conductive material in levitation and for heating and evaporating that material, using a varying electric current in the coil. Isolating member are placed in the coil to isolate the coil from the levitated material. The isolating member is part of a container made of non-conductive material. The container has one or more openings for guiding evaporated conductive material to the substrate to be coated. A method for coating a substrate using physical vapor deposition is also presented.

11 Claims, 1 Drawing Sheet

APPARATUS AND METHOD FOR COATING A SUBSTRATE

Figure 1:
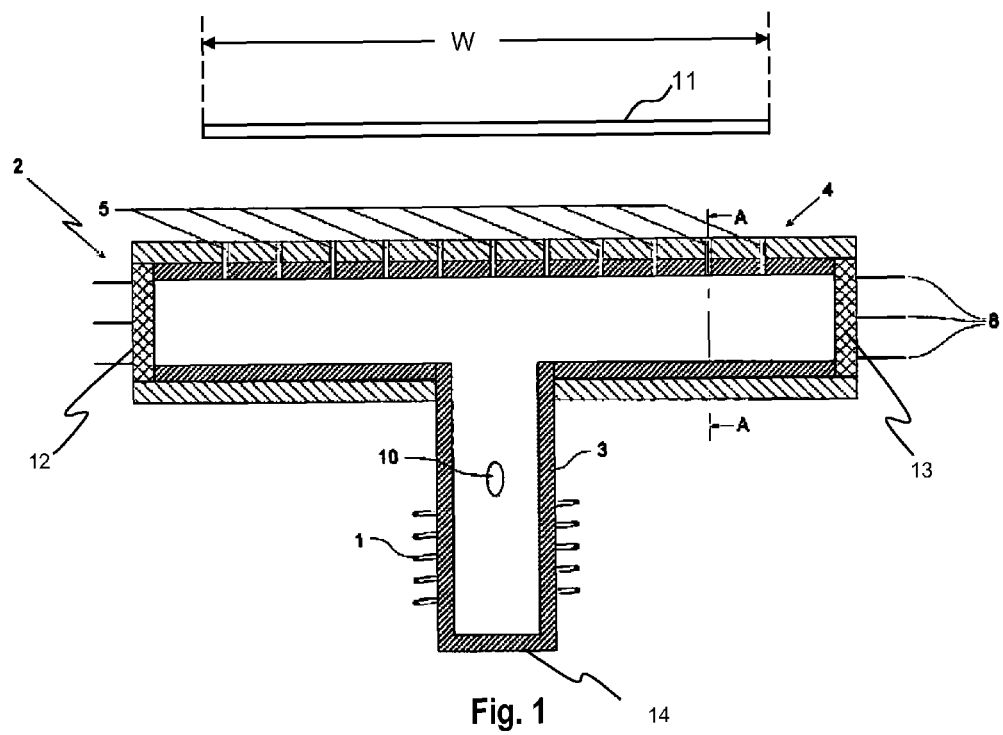

This application is a §371 National Stage Application of International Application No. PCT/EP2006/003924, filed on 27 Apr. 2006, claiming the priority of European Patent Application No. 05076265.7 filed on 31 May 2005.

The invention relates to an apparatus for coating a substrate using physical vapour deposition, comprising a vacuum chamber wherein a coil is placed for keeping an amount of conductive material in levitation and for heating and evaporating that material, using a varying electric current in the coil, and wherein means are placed in the coil to isolate the coil from the levitated material. The invention also relates to a method for coating a substrate using physical vapour deposition.

The levitation and evaporation of conductive material is known from WO 03/071000 A1. Herein a technology is described for coating a substrate with a layer of the conductive material that is condensed from the vapour phase on the substrate in a vacuum chamber. An amount of conductive material is kept floating above a coil in which a varying electric current is fed. Due to this current, an alternating electromagnetic field is generated in the coil. The electromagnetic field exerts an upward directed force on the conductive material. The electric current also provides electrical energy for heating the levitated conductive material, such that it melts and eventually evaporates; however, some conductive materials do not melt but sublimate. Between the coil and the levitated material electrical isolating means, such as a tube or duct, are present to prevent arcing between the windings of the coil and to prevent contamination of the coil and the vacuum chamber. The vapour produced is released through an end of the duct and used to coat substrates.

The above apparatus has the drawback that it is difficult to control the coating layer on the substrate. Especially when the apparatus is used to continuously coat a strip passing through the vacuum chamber, it is difficult to produce a coating having a uniform thickness and composition over the width of the strip.

To overcome this drawback WO 02/06558 A1 provides a vacuum chamber in which a strip can be transported, and a vapour can be transported to the strip by way of a duct having one or more restrictions, such that the vapour is deposited under choking conditions. This document gives a process for depositing two vapours at the same time, but the process can also be used for only one vapour. In this way a uniform coating can be applied on the strip when a number of openings are used in the restriction, and the duct is wide enough.

However, a drawback of coatings applied using this method is that the adhesion of the coating to the substrate is not optimal. Another drawback is that the density of the coating is not optimal. This makes it necessary to apply the coated substrate to a further processing step, such as rolling for strip.

It is an object of the invention to provide an apparatus and a method for coating a substrate using physical vapour deposition with which an improved coating on the substrate can be produced.

It is another an object of the invention to provide an apparatus and a method for coating a substrate using physical vapour deposition with which a layer of coated material having an increased adhesion and density can be produced on the substrate.

One or more of these objects are reached with an apparatus for coating a substrate using physical vapour deposition, comprising a vacuum chamber wherein a coil is placed for keeping an amount of conductive material in levitation and for heating and evaporating that material, using a varying electric current in the coil, and wherein means are placed in the coil to isolate the coil from the levitated material, the isolating means being part of a container made of non-conductive material, the container having one or more openings for guiding evaporated conductive material to the substrate to be coated.

With this apparatus it is possible to contain the evaporated material such, that the pressure inside the container is higher than the pressure in the vacuum chamber outside the container. Surprisingly, it has been found that the high pressure inside the container makes it possible to generate a plasma in the container, so a gas consisting of the evaporated material that is partly ionised: it contains atoms, ions, radicals and electrons. The plasma is generated at the frequencies of the varying current as mentioned in WO 03/071000 A1, for instance a frequency of 50 kHz or higher, which is much lower than the known frequencies for generating a plasma. Part of the plasma is guided through the openings, in front of which openings the substrate to be coated is placed. Due to the fact that the ions are charged, the coating has a better adhesion to the substrate and the coating is more dense as well. The container has to be made of non-conductive material since the ions will become atoms when they contact an electrically conductive wall.

Preferably, the container has the form of a duct which has seals at both ends, one or more openings being present in a seal. In this way a simple type of container is provided, with which the plasma is contained in the container and partly released through the openings to coat a substrate during use.

According to a preferred embodiment, the container has the form of a duct with a seal at one end and a box-shaped protuberance at the other end, the protuberance having a number of openings. This preferred embodiment is especially suitable to coat a strip, since the box-like protuberance can have a surface that has substantially the form of the substrate to be coated, resulting in an equal distance between the surface and the substrate. This will provide a uniform coating on the substrate.

Preferably, the protuberance is at least as wide as the substrate to be coated. This is especially important when a strip-like material is coated, so a material that has a length of at least a few hundred meters which is transported through the vacuum chamber. The strip can be made of paper, metal, plastic or other material. With the present embodiment of the container, the strip-like material can be coated over its full width.

Preferably, the openings have the form of a hole or a slit. The plasma can thus be released in an effective manner.

According to a preferred embodiment, the container has been provided with heating means to heat the container. The container should be heated, since the vapour and the plasma would condense against a cold wall.

Preferably, the container has been provided with heating elements made from conductive material, such as resistive wire of molybdenum or tungsten. In this way relatively simple heating elements are provided for heating the electrically non-conductive container.

According to a preferred embodiment, the container has been produced of ceramic material, such as boron nitride or silicon nitride. Ceramic material is very suitable for the conditions to which the apparatus is subjected, such as a high temperature and high thermal shocks and stresses. Moreover, ceramic material has a high thermal conductivity.

According to another aspect of the invention, a method is provided for coating a substrate using physical vapour deposition, using a coil in vacuum for keeping an amount of conductive material in levitation and for heating and evaporating that material, wherein a varying electric current is present in the coil, and wherein isolating means are placed between the coil and the levitated material, the isolating means being part of a container made of non-conductive material that is heated, the container having one or more openings for guiding evaporated conductive material to the substrate to be coated, wherein the evaporated material forms a plasma inside the container, which plasma is released through the openings in the container to coat the substrate.

This method provides a plasma in the container, having the advantages as discussed before.

Preferably, the container is heated to a temperature equal to or above the temperature of the levitated material. In this way the vapour or plasma cannot condense on the walls of the container.

According to a preferred embodiment, the plasma in the container has a pressure between $10^{-1}$ and $10^{-5}$ mbar, preferably between $10^{-2}$ and $10^{-4}$ mbar. At a pressure above $10^{-5}$ mbar, preferably above 104 mbar a plasma will be generated in the container, an this plasma will be maintained as long as the pressure does not become too high, so not above $10^{-1}$ mbar, preferably not above $10^{-2}$ mbar. It will be clear that the pressure depends on the type of conductive material to be vaporised, the temperature of the levitated conductive material, and the size of the container and the openings in it. Moreover, it will be clear that the pressure outside the container in the vacuum chamber has to be lower than the pressure of the plasma, so the plasma can be released through the openings in the container. Preferably, the pressure in the vacuum chamber is 10 to 1000 times lower than the pressure in the vacuum chamber, more preferably approximately 100 times lower.

According to an embodiment, the substrate coated is a strip that is continuously transported relative to the container. With the method according to the invention it is possible to provide a strip having a dense, well adhering coating.

According to a preferred embodiment, a potential gradient is maintained between the substrate and the container, such that the ions are accelerated towards the substrate. Due to the potential gradient, the ions have a high kinetic energy when they impinge on the surface of the substrate. This high kinetic energy either results in the ion adhering to the substrate or the coating already on the substrate, resulting in a very dense and very good adhering coating on the substrate, or in the rebounding of the ion on the surface of the substrate because the energy of the ion is too high. In the latter case, however, part of the energy of the ion is absorbed by the coating on the substrate, resulting in an additional compaction of the coating. The potential between the substrate and the container can be 10 to 40 Volt.

The invention will be elucidated referring to the attached drawing.

FIG. 1 schematically shows an embodiment of the apparatus according to the invention in cross section.

Figure 2:
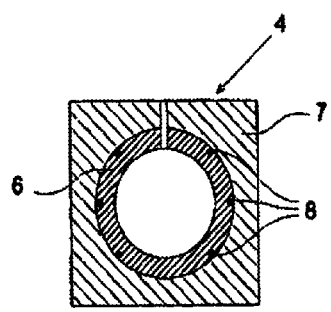

FIG. 2 shows another cross-section A-A through the apparatus of FIG. 1.

FIG. 1 shows a preferred embodiment of the apparatus according to the invention. In a vacuum chamber (not shown) a coil 1 is placed. A container 2 has a duct-like portion 3 that is placed in the coil 1, in which a vapour is produced. This portion 3 is closed at its lower end and at its higher end is connected to a box-like portion 4 that is designed to fit to a substrate to be coated. In a surface of the portion 4 openings 5 are present.

In the embodiment shown in FIG. 1 the container 2 is suitable for coating a strip 11 that is transported at short distance above the container. For this reason the portion 4 of the container 2 is elongated, so as to be able to coat the full width of the strip. As shown, the container 2 is at least as wide as a width "W" of the strip 11.

FIG. 2 shows another cross-section A-A through the container 2 of FIG. 1. This cross-section shows the box-like portion 4, where a tube 6 is inserted in a box 7 and electrical coils or wires 8 are placed between the tube 6 and the box 7.

During operation of the apparatus conductive material is introduced in the duct-like portion 3 of the container 2 using a feeding device (not shown). In the coil 1 a varying electric current is produced, generating an alternating electromagnetic field. Due to this electromagnetic field, the conductive material is kept levitating above the coil, while at the same time the conductive material is heated. The conductive material in most cases melts to form a droplet 10 and evaporates, and in some cases sublimates without melting.

The container 2 and the duct-line portion 3 of the container 2 is closed via seals 12, 13, and 14. Since the container 2 is closed but for a number of openings 5, due to the evaporation of the droplet 10 the pressure inside the container becomes higher than the pressure in the surrounding vacuum chamber.

Surprisingly, this makes it possible to generate a plasma inside the container and to maintain this plasma inside the container by using an electrically isolating or non-conductive material as material for the container itself, so as to maintain the plasma. The plasma in the container has a pressure between $10^{-1}$ and $10^{-5}$ mbar, preferably between $10^{-2}$ and $10^{-4}$ mbar. At a pressure above $10^{-5}$ mbar, preferably above $10^{-4}$ mbar a plasma will be generated in the container, an this plasma will be maintained as long as the pressure does not become too high, so not above $10^{-1}$ mbar, preferably not above $10^{-2}$ mbar. The plasma is generated at the frequencies of the varying current as mentioned in WO 03/071000 A1, for instance a frequency of 50 kHz or higher, which is much lower than the known frequencies for generating a plasma. Of course the pressure in the surrounding vacuum chamber has to be lower than the pressure in the container, so the plasma can be released through the openings 5.

Moreover, the container has to be heated to a temperature equal to or above the temperature of the vapour/plasma, to prevent condensation of the vapour/plasma on the walls of the container. To do so, electric coils or wires 8 are used inside the walls of the container. Since the container has to be heat resistant and thermal shock resistant, and have a high thermal conductivity, usually a ceramic material is used, such as boron nitride or silicon nitride, but other ceramics are also possible, such as zirconium oxide, yttrium oxide, hafnium bromide or zirconium bromide, since ceramics are electrically non-conductive.

The openings in the container can have any form, but usually are round holes or slits. The total surface of the openings depends on the volume of the container and the coating rate. Also the distance between the openings is variable, and will depend on the distance between the surface of the container in which the holes are present and the substrate to be coated. Usually, the plasma released from the container through a hole has a flame-like form.

Due to the fact that the ions in the plasma are charged, the ions will adhere better to the substrate and form a denser coating.

The adherence and the density of the coating can be further improved by applying a potential difference between the container and the substrate to be coated. Due to the potential difference, the ions are accelerated towards the substrate and thus will impinge on the surface having a high velocity. This results in a very good adhering coating having a high density. A suitable potential difference is 10 to 40 Volt.

The invention claimed is:

1. Apparatus for coating a substrate using physical vapour deposition, comprising:
   a vacuum chamber wherein a coil is placed for keeping an amount of conductive material in levitation and for heating and evaporating that material, using a varying electric current in the coil;
   a container made of an electrically non-conductive material,
      the container comprising a first portion placed in the coil to isolate the coil from the levitated material,
      the container comprising a second portion, having one or more openings for guiding evaporated conductive material to the substrate to be coated; and
   wherein the first portion is vertical and the second portion is horizontal and the first portion has an open top end in communication with an interior of the second portion;
   at least one heating means disposed at the second portion of the container to prevent condensation of vaporized conductive material, wherein the second portion of the container has the form of a box-shaped protuberance,
   wherein the protuberance is at least as wide as the substrate to be coated,
   wherein the box shaped protuberance has a top wall, a bottom wall, a front wall and a rear wall and opposed end walls,
   wherein the heating means comprise resistive wire heating elements made from a conductive material,
   wherein the second portion of the container has a box portion, wherein a tube is inserted completely within the box portion and the at least one heating means comprises one or more electrical coils or wires placed between the tube and the box portion,
   wherein the tube and box portion are concentric and parallel,
   wherein the tube extends longitudinally from the box first end wall to the box second end wall, wherein the tube lines the inner walls of the box portion, wherein the one or more openings for guiding evaporated conductive material to the substrate to be coated pass through the box portion upper walls and the tube,
   wherein the at least one heating means comprising one or more electrical coils or wires placed between the tube and the box portion are immobilized by contact with the tube and inner wall of the box portion, and
   wherein the tube has a circular inner wall and a circular outer wall, the tube being a cylinder having an upper longitudinal semi-cylinder and a lower longitudinal semi-cylinder which meet at an equator, wherein in a cross-sectional plane, transverse to the longitudinal axis of the tube, a first transverse arc along the outer wall of the upper semi-cylinder from a said opening to a first portion of wire passing within the box-shaped protuberance along the upper semi-cylinder is shorter than a second transverse arc along the outer wall of the upper semi-cylinder from said opening to the equator.

2. Apparatus according to claim 1, wherein the one or more openings have the form of a hole or a slit.

3. Apparatus according to claim 1, wherein the container comprises a ceramic material.

4. Apparatus according to claim 1, wherein the heating elements comprise a resistive wire of molybdenum or tungsten.

5. Apparatus according to claim 1, wherein the container has been produced of boron nitride or silicon nitride.

6. Method for coating a substrate using the apparatus of claim 1 for physical vapour deposition, comprising:
   using a coil in vacuum for keeping an amount of conductive material in levitation and for heating and evaporating that material, wherein a varying electric current is present in the coil,
   wherein isolating means are placed between the coil and the levitated material, wherein the isolating means are part of a container made of non-conductive material that is heated, the container having one or more openings for guiding evaporated conductive material to the substrate to be coated,
   wherein the evaporated material forms a plasma inside the container,
   releasing the plasma through the one or more openings in the container to coat the substrate.

7. Method according to claim 6, wherein the container is heated to a temperature equal to or above the temperature of the levitated material.

8. Method according to claim 6, wherein the plasma in the container has a pressure between $10^{-1}$ and $10^{-5}$ mbar.

9. Method according to claim 6, wherein the substrate coated is a strip that is continuously transported relative to the container.

10. Method according to claim 6, wherein a potential gradient is maintained between the substrate and the container, such that ions of the material are accelerated towards the substrate.

11. Method according to claim 6, wherein the plasma in the container has a pressure between $10^{-2}$ and $10^4$ mbar.

* * * * *